United States Patent
Asako

(10) Patent No.: US 10,083,859 B2
(45) Date of Patent: Sep. 25, 2018

(54) COATING FORMATION METHOD AND SEMICONDUCTOR DEVICE MANUFACTURING METHOD USING THE COATING FORMATION METHOD

(71) Applicant: TOKYO ELECTRON LIMITED, Tokyo (JP)

(72) Inventor: Ryuichi Asako, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/511,408

(22) PCT Filed: Jul. 10, 2015

(86) PCT No.: PCT/JP2015/069899
§ 371 (c)(1),
(2) Date: Mar. 15, 2017

(87) PCT Pub. No.: WO2016/042898
PCT Pub. Date: Mar. 24, 2016

(65) Prior Publication Data
US 2017/0294344 A1 Oct. 12, 2017

(30) Foreign Application Priority Data
Sep. 19, 2014 (JP) .................................. 2014-191437

(51) Int. Cl.
H01L 21/768 (2006.01)
H01L 21/311 (2006.01)
H01L 21/02 (2006.01)
C23C 8/06 (2006.01)

(52) U.S. Cl.
CPC .......... H01L 21/76831 (2013.01); C23C 8/06 (2013.01); H01L 21/02063 (2013.01); H01L 21/31116 (2013.01); H01L 21/31144 (2013.01); H01L 21/76814 (2013.01); H01L 21/76877 (2013.01)

(58) Field of Classification Search
CPC ......... H01L 21/76831; H01L 21/31116; H01L 21/31144; H01L 21/76814
See application file for complete search history.

(56) References Cited

U.S. PATENT DOCUMENTS

2015/0259570 A1* 9/2015 Matsuoka ................ C09D 7/12
524/588

FOREIGN PATENT DOCUMENTS

| JP | 2002-083869 | 3/2002 |
| JP | 2003-229482 | 8/2003 |

OTHER PUBLICATIONS

International Search Report dated Sep. 8, 2015.

* cited by examiner

Primary Examiner — Dung Le

(57) ABSTRACT

In the present method, a substrate to be processed, having an interlayer insulation film, is prepared (step 1). The interlayer insulation film is subjected to dry etching, while using a mask layer, thereby forming recesses (step 2). Residue is removed by dry ashing (step 3). A coating is formed on the entire surface by means of a gas process using a coating compound gas, with a molecular structure having at one terminal a first substitution group that reacts with and bonds with the surface of the interlayer insulation film, and at the other terminal a second substitution group that is hydrophilic (step 4). The coating is removed by wet cleaning (step 5). Wiring is formed in the recesses (step 6).

16 Claims, 6 Drawing Sheets

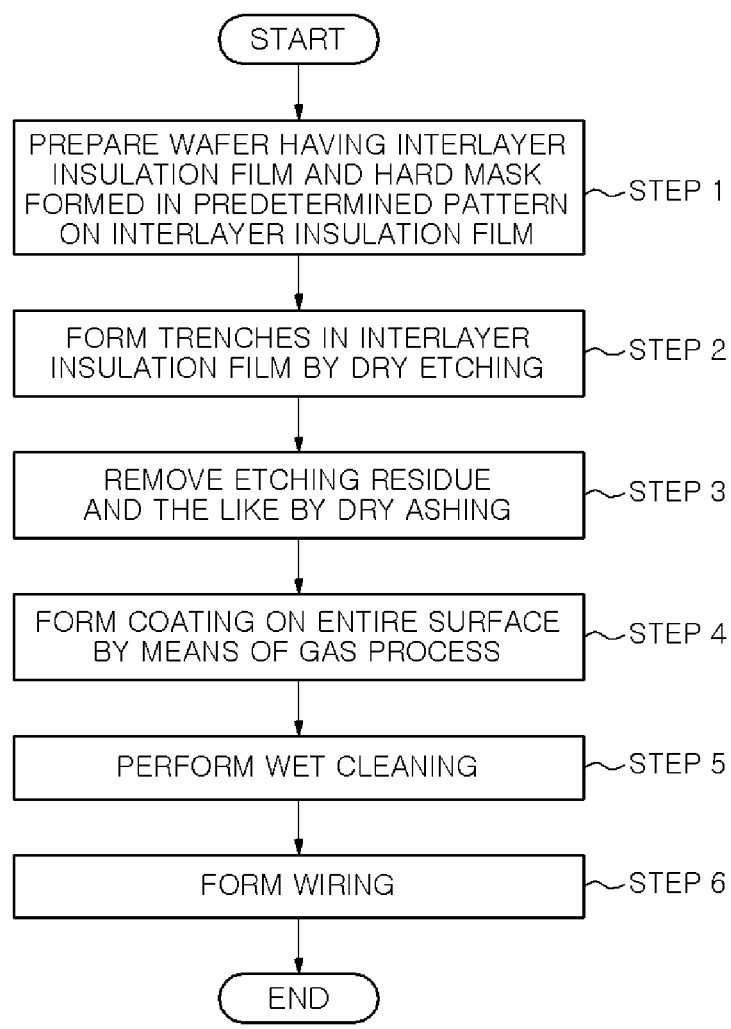

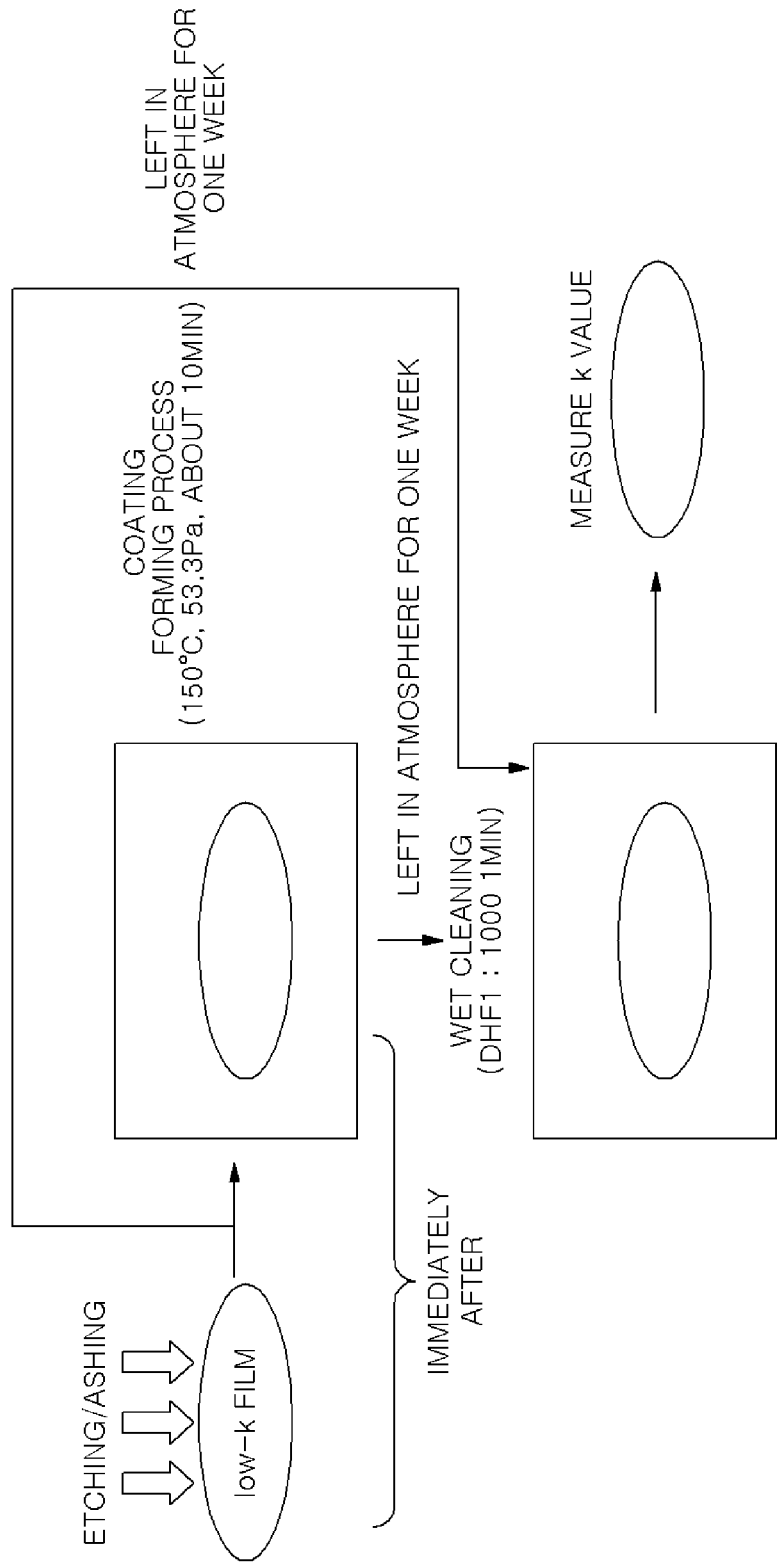

COATING FORMATION METHOD AND SEMICONDUCTOR DEVICE MANUFACTURING METHOD USING THE COATING FORMATION METHOD

CROSSREFERENCE TO RELATED APPLICATIONS

This application is a National Stage Application of, and claims priority to, PCT Application No. PCT/JP2015/069899, filed on Jul. 10, 2015, entitled "SEMICONDUCTOR DEVICE MANUFACTURING METHOD, COATING FORMATION METHOD, AND COATING FORMATION DEVICE," which claims priority to Japanese Patent Application No. 2014-191437, filed on Sep. 19, 2014. The foregoing patent applications are herein incorporated by reference by entirety for all purposes.

FIELD OF THE INVENTION

The present invention relates to a semiconductor device manufacturing method for manufacturing semiconductor devices by forming recesses in an interlayer insulation film and forming wiring in the recesses, a coating formation method, and a coating formation device.

BACKGROUND OF THE INVENTION

Recently, in order to meet demands for high-speed semiconductor device, miniaturization of a wiring pattern and high level of integration, it is required to decrease an inter-wiring capacitance and realize high conductivity of wiring and high electromigration resistance. In view of the above, Copper (Cu), which has a higher electromigration resistance and a higher conductivity than those of aluminum (Al) and tungsten (W), is being used as a wiring material. As for a technique for forming a Cu wiring, there is often used a damascene method for forming a recess such as a wiring groove (trench), a connecting opening (hole) or the like in an interlayer insulation film and then filling Cu in the recess (see, e.g., Patent Document 1). As the miniaturization of the semiconductor devices advances, a parasitic capacitance of the interlayer insulation film is an important factor for improving performance of the wiring. As for the interlayer insulation film, a low-k film made of a low-k material is used.

In order to accurately form a recess in the interlayer insulation film, it is suggested to use a metal hard mask such as a Ti film or a TiN film as an etching mask (see, e.g., Patent Document 2).

Patent Document 1: Japanese Patent Application Publication No. 2002-083869

Patent Document 2: Japanese Patent Application Publication No. 2003-229482

However, in the case of manufacturing the Cu wiring, the recess is formed in the interlayer insulation film by dry etching while using the metal hard mask. If necessary, an etching residue, the hard mask or the like is removed by dry ashing. Next, wet cleaning is performed and, then, a wiring forming process is performed.

At this time, if a period of time between the dry etching and the wet cleaning or between the dry ashing and the wet cleaning is long, a film quality of the interlayer insulation film may deteriorate. Especially, in the case of using a low-k film as the interlayer insulation film, a dielectric constant is increased until the wet cleaning is started. If the film quality of the interlayer insulation film deteriorates, problems such as a decrease in reliability after next wiring formation and the like are caused.

Therefore, conventionally, it is required to strictly manage a period of time between the etching process and a next cleaning process or between the ashing process and a next cleaning process. This leads to a decrease in a yield of a product and the like.

In order to solve the above problems, it is considered to avoid contact between the interlayer insulation film and exterior air by forming a coating on the interlayer insulation film after the etching process or the ashing process. However, it is required that the coating be simply formed and easily removed before the wiring forming process, preferably before the cleaning process or during the cleaning process, so that the wiring or the like is not adversely affected. There is not yet discovered a technique that satisfies the above demands while ensuring sufficient protection.

SUMMARY OF THE INVENTION

In view of the above, the disclosure provides semiconductor device manufacturing method, coating formation method, and a coating formation device which are capable of practically suppressing deterioration of a film quality of an interlayer insulation film between a process of forming recesses in the interlayer insulation film by dry etching or a process of performing dry ashing after the dry etching and a wiring forming process.

In accordance with a first aspect of the present disclosure, there is provided a semiconductor device manufacturing method including: preparing a substrate to be processed having an interlayer insulation film; performing dry etching on the interlayer insulation film while using a mask layer to form recesses; forming a coating on an entire top surface of the substrate by a gas process using a gas of a coating compound with a molecular structure having at one end a first substitution group that reacts with and bonds to a surface of the interlayer insulation film and at the other end a second substitution group that is hydrophilic; removing the coating; and forming wiring in the recesses.

The interlayer insulation film may contain Si, and the first substitution group of the coating compound bonds with Si of the interlayer insulation film. The interlayer insulation film may be a Si-containing low-k film.

The first substitution group of the coating compound may be an alkoxysilyl group, and the alkoxysilyl group reacts with Si—OH of the interlayer insulation film to form siloxane bonds. The second substitution group of the coating compound may be an amino group.

The coating compound may be selected among N-phenyl-3-aminopropyltrimethoxysilane, (N-(2-aminoethyl)-3-aminopropyltrimethoxysilane, 3-aminopropyltrimethoxysilane, and 3-aminopropyltriethoxysilane.

The dry etching may be plasma etching. The semiconductor device manufacturing method may further includes performing dry ashing on the substrate that has been subjected to the dry etching, wherein the coating is formed after the dry ashing. The dry ashing may be plasma ashing. The coating may be removed by wet cleaning.

In accordance with a second aspect of the present disclosure, there is provided a coating formation method for forming a coating that protects an interlayer insulation film of a substrate to be processed, the coating being removable in a subsequent process, after dry etching is performed to form recesses for wiring formation on the interlayer insulation film or after dry ashing is performed after the dry etching, wherein: the coating is formed on the interlayer insulation film by a gas process using a gas of a coating compound with a molecular structure having at one end a first substitution group that reacts with and bonds to a surface of the interlayer insulation film and at the other end a second substitution group that is hydrophilic.

In accordance with a third aspect of the present disclosure, there is provided a coating formation device for forming a coating that protects an interlayer insulation film of a substrate to be processed, the coating being removable in a subsequent process, after dry etching is performed to form recesses for wiring formation on the interlayer insulation film or after dry ashing is performed after the dry etching, the coating formation device including: a processing chamber configured to accommodate the substrate that has been subjected to the dry etching for forming the recesses on the interlayer insulation film; a gas exhaust unit configured to exhaust an inside of the processing chamber; a heating unit configured to heat the inside of the processing chamber to a predetermined temperature; and a gas supply unit configured to supply into the processing chamber a gas of a coating compound with a molecular structure having at one end a first substitution group that reacts with and bonds to a surface of the interlayer insulation film and at the other end a second substitution group that is hydrophilic.

According to the present disclosure, since forming a coating on an entire surface by a gas process using a coating compound gas with a molecular structure having at one terminal a first substitution group that reacts with and bonds with a surface of the interlayer insulation film and at the other terminal a second substitution group that is hydrophilic after forming recesses by performing dry etching on the interlayer insulation film, and removing the coating before forming wiring in the recesses, a deterioration of a film quality of an interlayer insulation film can be practically suppressed between a process of forming recesses in the interlayer insulation film by dry etching and/or a process of performing dry ashing, and a wiring forming process.

BRIEF DESCRIPTION OF THE DRAWINGS

FIG. 1 is a flowchart showing a semiconductor device manufacturing method according to a first embodiment.

FIG. 6 schematically shows a scheme of a test that has examined an effect of the present disclosure.

DETAILED DESCRIPTION OF THE EMBODIMENTS

Hereinafter, embodiments will be described with reference to the accompanying drawings.
(Semiconductor Device Manufacturing Method)
FIG. 1 is a flowchart showing a semiconductor device manufacturing method according to a first embodiment.

FIGS. 2A to 2E are cross sectional views of principal parts showing the process sequence of the semiconductor device manufacturing method.

In the present embodiment, first, there is prepared a semiconductor wafer (hereinafter, simply referred to as "wafer") W in which an interlayer insulation film 102 made of a Si-containing material is formed on a lower structure 101 (details are omitted) on a Si base 100 and, then, a hard mask layer 103 is formed thereon in a predetermined pattern (step 1, FIG. 2A).

As for the interlayer insulation film 102, there may be used a Si-containing low-k film made of a Si-containing compound and having a low dielectric constant of, e.g., 3.5 or less. As for the Si-containing low-k film, SiOC or SiOF may be preferably used. The interlayer insulation film 102 may be a $SiO_2$ film that has been conventionally used.

The hard mask layer 103 is preferably a metal hard mask layer using a metal-based material made of a metal or a metal compound. As for the material, TiN, TaN, Ti and Ta may be preferably used. The hard mask layer 103 is obtained by forming a metal film and a metal compound film and performing plasma etching while using a photoresist patterned by photolithography as a mask.

Figure 2A:
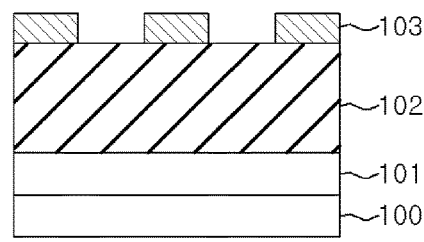
FIGS. 2A to 2E are cross sectional views showing principal parts of the semiconductor device according to the process sequence of the semiconductor device manufacturing method of the first embodiment.
Figure 2B:
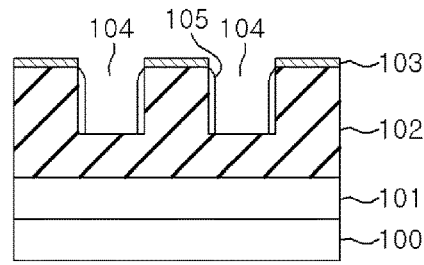

Next, the interlayer insulation film 102 is dry-etched while using the hard mask layer 103 as an etching mask and trenches 104 as recesses are formed in a predetermined pattern in the interlayer insulation film 102 (step 2, FIG. 2B).

As for the dry etching, it is possible to use conventional plasma etching using a plasma of an etching gas such as a CF-based gas or the like. In the case of applying a dual damascene method, via holes are formed at bottom portions of the trenches 104. In that case, trenches may be formed after via holes (not shown) are formed while using a predetermined mask, or the via holes may be formed after the trenches 104 are formed.

Figure 2C:
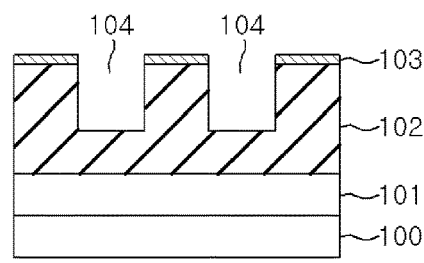

After the trenches 104 are formed, an etching residue 105 or the like is removed by performing dry ashing, if necessary (step 3, FIG. 2C).

As for the dry ashing, conventional plasma ashing using $CO_2$ gas or $N_2$ gas/$H_2$ gas and the like may be preferably used. A remaining portion of the hard mask layer 103 may be removed by the dry ashing.

Figure 2D:
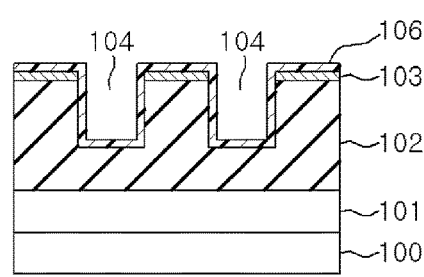
Figure 2E:
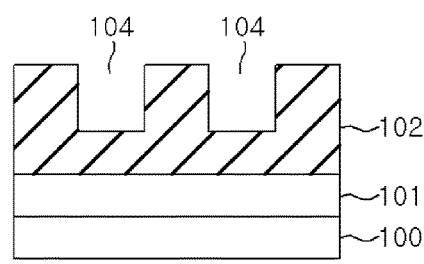

Immediately after the dry ashing or immediately after the dry etching in the case of not performing the dry ashing, a coating 106 is formed on the entire top surface by a gas process (step 4, FIG. 2D).

By forming the coating 106, the interlayer insulation film 102 is shielded from external air. The coating 106 can be formed by performing a gas process using a coating compound gas with a molecular structure having at one end a first substitution group that reacts with and bonds to the surface of the interlayer insulation film 102 and at the other end a second substitution group that is hydrophilic. Specifically, the coating made of a coating compound is formed by supplying a gas containing the coating compound gas and adsorbing the coating compound gas on the entire top surface of the wafer W. The coating 106 can be easily formed because the first substitution group of one end bonds with Si of the surface of the interlayer insulation film 102 simply by supplying the coating compound gas. As a result of the bonding between the first substitution group of one end of the molecule and the interlayer insulation film 102, the second substitution group of the other end forms the surface. Since, however, the second substitution group forming the surface is hydrophilic, the coating can be easily removed by wet cleaning.

When the interlayer insulation film 102 contains Si as in the case of a Si-containing low-k film, an alkoxysilyl group may be preferably used as the first substitution group of the coating compound. It is known that when etching or ashing is performed on the interlayer insulation film 102 containing Si, a large number of OH groups such as Si—OH exist on the surface. However, an alkoxysilyl group reacts with Si—OH on the surface of the Si-containing interlayer insulation film 102, thereby forming siloxane bonds (Si—O—Si bonds). As for the second substitution group that is hydrophilic, an amino group may be used.

As for the compound with a molecular structure having at one end the first substitution group and at the other end the second substitution group, there may be used N-phenyl-3-aminopropyltrimethoxysilane having a structure shown in the following formular (1), (N-(2-aminoethyl)-3-aminopropyltrimethoxysilane having a structure shown in the following formular (2), 3-aminopropyltrimethoxysilane having a structure shown in the following formular (3), 3-aminopropyltriethoxysilane having a structure shown in the following formular (4), and the like.

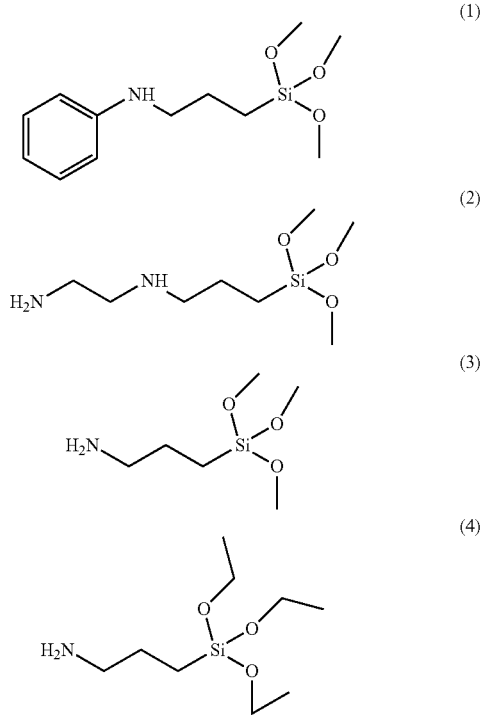

The first substitution group may be an aminosilyl group, a hydroxysilyl group, a halogenated silyl group or the like, other than an alkoxysilyl group. The second substitution group may be a hydroxyl group, a carboxyl group or the like, other than an amino group.

The gas process for forming the coating 106 may be performed by supplying a processing gas containing the coating compound gas into a processing chamber maintained at a vacuum level of, e.g., about 1 Pa to 133.3 Pa, in a state where the wafer W is heated to about 50° C. to 200° C. As for the processing gas, it is possible to supply an inert gas serving as a dilution gas, such as $N_2$ gas, Ar gas or the like, in addition to the coating compound gas.

The coating 106 can be formed by the gas process similar to etching or ashing. Therefore, the process of forming the coating 106 can be continuously performed after the etching or the ashing without exposure to the atmosphere in the processing system for performing etching and ashing. It is preferable to continuously perform the process of forming the coating 106 without exposure to the atmosphere. However, the process of forming the coating 106 may be performed, after exposure to the atmosphere after the etching or the ashing if the time required in the exposure to the atmosphere is short.

The wafer W having the coating 106 formed thereon is subjected to the wet cleaning. Accordingly, the coating 106, an ashing residue, a remaining portion of the hard mask layer 103 and the like are removed (step 5, FIG. 2E).

The wet cleaning may be performed by using a method for supplying liquid chemical while rotating the wafer W, or a method for immersing the wafer W in liquid chemical stored in a tank. As for the liquid chemical, it is possible to use conventional wafer cleaning liquid chemical such as ammonia-based liquid chemical such as an ammonia hydrogen peroxide mixture (APM), fluorine-based liquid chemical such as diluted hydrofluoric acid (DHF), sulfate-based liquid chemical such as a sulfuric acid peroxide mixture (SPM) or the like. Types and concentration of liquid chemical are selected depending on materials of the Si-based interlayer insulation film 102 and those of the coating 106 such that the coating 106 can be etched with a high selectivity with respect to the Si-based interlayer insulation film 102.

Upon completion of the cleaning process, wiring is formed in the trenches 104 (step 6). For example, the wiring is formed by forming a barrier film or the like in the trenches 104, filling a Cu film in the trenches 104, and polishing the entire surface by CMP (Chemical Mechanical Polishing).

In the conventional semiconductor device manufacturing process, the coating is not formed after dry etching or dry ashing, and the film quality of the interlayer insulation film deteriorates if a period of time between the dry etching or the dry ashing and the wet cleaning is long. Especially, in the case of using a low-k film as the interlayer insulation film, a dielectric constant is increased until the wet cleaning is started. If the film quality of the interlayer insulation film deteriorates, problems such as a decrease in reliability after next wiring formation and the like are caused. Thus, conventionally, it is required to strictly manage a period of time between the etching process or the ashing process and a next cleaning process. However, this leads to a decrease in a yield of a product. Accordingly, such drawbacks need to be solved.

In the present embodiment, in order to solve the above drawbacks, the coating 106 is formed after the etching or the ashing and the contact with external air is prevented.

As for a method for forming a coating, a gas process and a liquid process may be considered. The liquid process is generally performed by using an atmospheric pressure device, and a device different from a vacuum system device used in the etching is additionally required in consecutively performing the liquid process after the etching. For that reason, the liquid process is not practical in terms of cost. On the other hand, the gas process may be performed by using the vacuum system device and is practical. Therefore, in the present embodiment, the gas process is employed.

However, it is required that the coating 106 be practically formed and easily removed before the wet cleaning process or during the wet cleaning process so that the wiring or the like is not adversely affected. Further, the coating 106 needs to provide sufficient protection. Therefore, various examinations have been performed.

If the compound used for the gas process has at one end the first substitution group that reacts with and bonds to the surface of the interlayer insulation film 102, the coating 106 can be easily formed by the reaction therebetween. On the other hand, the other end of the molecule which does not contribute to the reaction with the interlayer insulation film 102 is preferably hydrophobic to provide better protection, and thus needs to avoid contact with moisture. For that reason, if a hydrophobic substitution group is employed as the second substitution group of the other end which does not contribute to the reaction with the interlayer insulation film 102, it is difficult to remove the coating in a next wet cleaning process because the liquid chemical is repelled by the coating.

However, as a result of various examinations, it has been found that even when the second substitution group is hydrophilic, molecules of the compound for forming the coating can protect the interlayer insulation film 102 from moisture in air or the like and the coating can be easily removed by the wet cleaning process by employing the second substitution group that is hydrophilic.

From the above, in the present embodiment, as described above, the coating 106 is formed by adsorbing on the entire top surface of the wafer W the coating compound gas with a molecular structure having at one end the first substitution group that reacts with and bonds with the surface of the interlayer insulation film 102 and at the other end the second substitution group that is hydrophilic. Accordingly, the coating 106 can be simply and practically formed by the gas process using the vacuum system device used for etching or ashing. Further, the coating 106 can be easily removed by wet cleaning. Moreover, the coating 106 can sufficiently suppress deterioration of the interlayer insulation film 102 after the etching or the ashing.

(Processing System)

Figure 3:
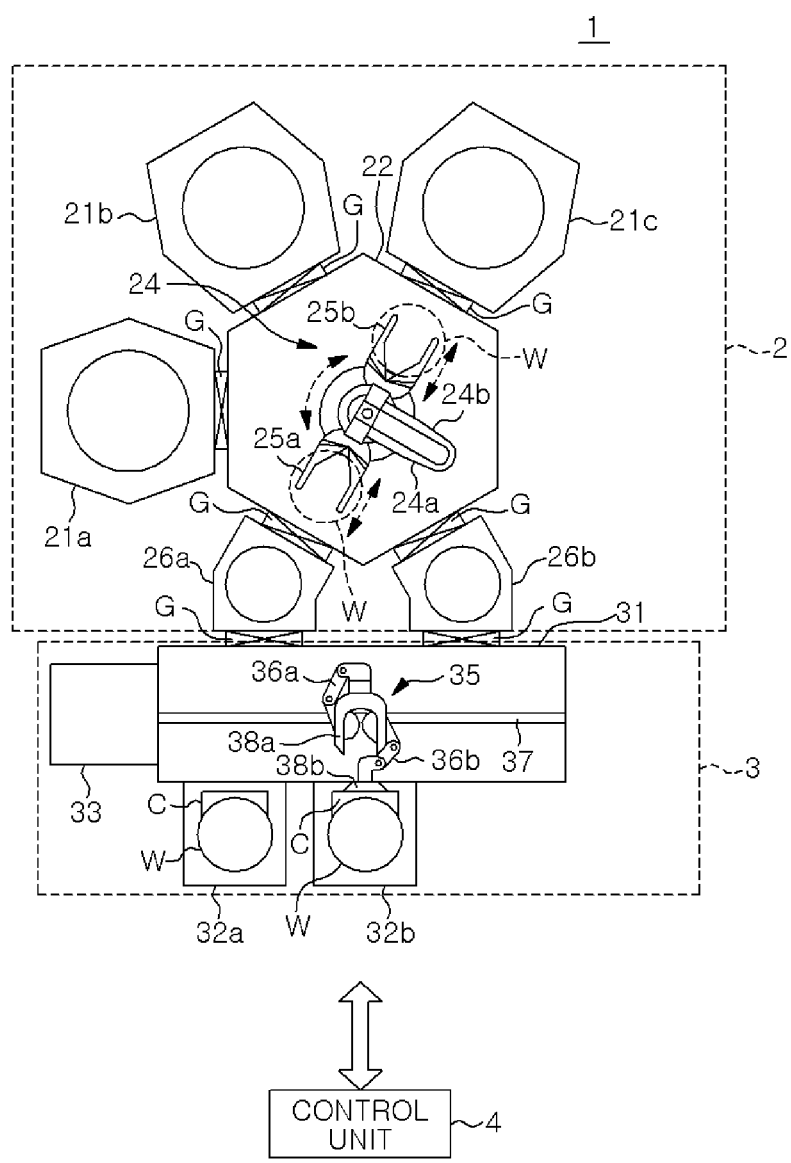
FIG. 3 schematically shows a processing system suitable for the semiconductor device manufacturing method according to the first embodiment.

Hereinafter, a processing system suitable for the semiconductor device manufacturing method according to the first embodiment will be described. FIG. 3 schematically shows the processing system suitable for the semiconductor device manufacturing method according to the first embodiment.

As shown in FIG. 3, a processing system 1 is configured as a cluster tool type (multi-chamber type) semiconductor device manufacturing apparatus. The processing system 1 includes a processing unit 2 for processing a wafer W, a loader module 3 for loading/unloading the wafer W into/from the processing unit 2, and a control unit 4 for controlling components of the processing system 1.

The processing unit 2 includes: a vacuum transfer chamber 22 maintained in a vacuum state and having a hexagonal shape when seen from the top; an etching apparatus 21*a*, an ashing apparatus 21*b* and a coating forming apparatus 21*c* which are respectively installed at wall portions corresponding to three sides of the vacuum transfer chamber 22; and load-lock chambers 26*a* and 26*b* which are respectively installed at wall portions corresponding to other two sides of the vacuum transfer chamber 22, and which can be switched between a vacuum state and an atmospheric state. The etching apparatus 21*a*, the ashing apparatus 21*b*, the coating forming apparatus 21*c*, and the load-lock chambers 26*a* and 26*b* are connected to the vacuum transfer chamber 22 via respective gate valves G. When ashing is not performed, the ashing apparatus 21*b* may not be installed.

Provided in the vacuum transfer chamber 22 is a first transfer unit 24 for loading/unloading the wafer W into/from the etching apparatus 21*a*, the ashing apparatus 21*b*, the coating forming apparatus 21*c*, and the load-lock chambers 26*a* and 26*b*. The first transfer unit 24 is installed substantially at the center of the vacuum transfer chamber 22. The first transfer unit 24 includes transfer arms 24*a* and 24*b* that are rotatable and extensible/contractible. Two supporting arms 25*a* and 25*b* for supporting the wafer W are provided at leading ends of the transfer arms 24*a* and 24*b*, respectively.

The loader module 3 includes an atmospheric transfer chamber 31 having an inner pressure controlled to an atmospheric pressure or to a pressure level slightly higher than an atmospheric pressure. The atmospheric transfer chamber 31 has a rectangular shape when seen from the top. The load-lock chambers 26*a* and 26*b* are connected to a wall portion corresponding to one long side of the atmospheric transfer chamber 31. Gate valves G are provided between the load-lock chambers 26*a* and 26*b* and the atmospheric transfer chamber 31. Two connection ports 32*a* and 32*b* for connecting carriers C accommodating therein wafers W are connected to a wall portion corresponding to the other long side of the atmospheric transfer chamber 31. Shutters (not shown) are respectively installed at the connection ports 32*a* and 32*b*. When the carriers C that are empty or accommodate therein the wafers W are directly connected to the connection ports 32*a* and 32*b*, the shutters are opened to allow the communication with the atmospheric transfer chamber 31 while preventing introduction of external air. An alignment chamber 33 is installed at a wall portion corresponding to one short side of the atmospheric transfer chamber 31. The wafer W is aligned in the alignment chamber 33.

Provided in the atmospheric transfer chamber 31 is a second transfer unit 35 for loading/unloading the wafer W into/from the carrier C, the load-lock chambers 26*a* and 26*b* and the alignment chamber 33. The second transfer unit 35 has two multi-joint arms 36*a* and 36*b* and is configured to be movable on a rail 37 extending along a lengthwise direction of the loader module 31. Hands 38*a* and 38*b* are attached to leading ends of the multi-joint arms 36*a* and 36*b*, respectively. The wafer W is transferred while being held on the hand 38*a* or 38*b*.

A control unit 4 includes: a process controller having a micro processor (computer) for controlling the respective components; a user interface having a keyboard through which an operator inputs commands to manage the processing system, a display for visualizing and displaying an operational state of the processing system 1, and the like; a storage unit in which control programs for realizing processes performed in the processing system 1 under the control of the process controller, various data, and programs, i.e., processing recipes, for allowing the respective components of the processing apparatus to perform processes based on processing conditions. If necessary, any recipe is read out from the storage unit in response to an instruction from the user interface or the like and executed in the process controller. Accordingly, a desired process in the processing system 1 is performed under the control of the process controller.

In the processing system 1, a single wafer W is unloaded from the carrier C accommodating therein a plurality of wafers W, each having a structure shown in FIG. 2A, and transferred to any one of the load-lock chambers 26*a* and 26*b* by the second transfer unit 35. A pressure in the load-lock chamber to which the wafer W is transferred is decreased to a vacuum level equal to that in the vacuum transfer chamber 22. Then, the wafer W is unloaded from the load-lock chamber and transferred to the etching apparatus 21*a* by the first transfer unit 24. The interlayer insulation film of the wafer W is subjected to dry etching, typically plasma etching, under a vacuum atmosphere by the etching apparatus 21a.

Upon completion of the etching, the wafer W is unloaded from the etching apparatus 21a and transferred to the ashing apparatus 21b by the first transfer unit 24. An etching residue or the like is removed by performing dry ashing, typically plasma ashing, under a vacuum atmosphere by the ashing apparatus 21b.

Upon completion of the ashing, the wafer W is unloaded from the ashing apparatus 21b and transferred to the coating forming apparatus 21c by the first transfer unit 24. Next, in the coating forming apparatus 21c, a coating forming process is performed by a gas process under a vacuum atmosphere. In the case of not performing ashing, the wafer W unloaded from the etching apparatus 21a is transferred to the coating forming apparatus 21c by the first transfer unit 24 and subjected to the coating forming process.

Upon completion of the coating forming process, the wafer W is transferred to any one of the load-lock chambers 26a and 26b. Next, a pressure in the load-lock chamber 26a or 26b is returned to an atmospheric pressure. Thereafter, the wafer W on which the coating is formed is unloaded and returned to the carrier C by the second transfer unit 35. Such processes are repeated for all of the wafers W in the carrier.

The processing system 1 is obtained simply by applying a coating forming apparatus that is a vacuum system apparatus to a conventional processing system for performing etching and ashing, which is practical without increasing an apparatus cost. In addition, since the formation of the coating can be continued from the etching or the ashing without breaking vacuum, the deterioration of the interlayer insulation film can be reliably prevented.

(Coating Forming Apparatus)

First Example

Figure 4:
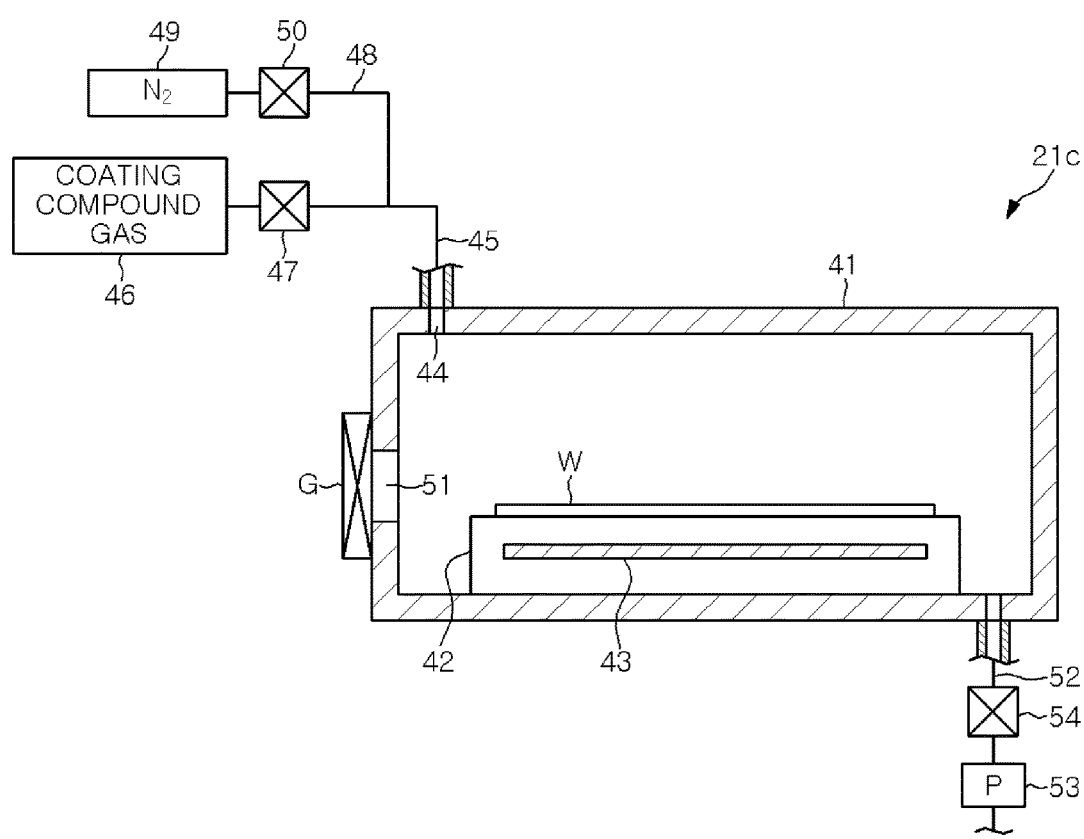
FIG. 4 is a cross sectional view showing a first example of a coating formation device that can be installed at the processing system shown in FIG. 3.

FIG. 4 is a cross sectional view showing a first example of the coating forming apparatus 21c. Here, a single-sheet processing apparatus will be described as an example.

As shown in FIG. 4, the coating forming apparatus 21c of the present example includes an evacuable processing chamber 41 made of, e.g., aluminum and the like. A mounting table 42 for mounting thereon the wafer W is provided at a bottom portion of the processing chamber 41. A heater 43 is provided in the mounting table 42. The heater 43 radiates heat by power supplied from a heater power supply (not shown).

A processing gas inlet port 44 for introducing a processing gas that is a coating compound gas or an inert gas such as $N_2$ gas is formed at a ceiling wall of the processing chamber 41. A gas supply line 45 is connected to the gas inlet port 44. A coating compound gas supply source for supplying a coating compound gas for forming a coating on the wafer W is connected to a base end side of the gas supply line 45. A flow rate controller 47 is installed in the gas supply line 45. A $N_2$ gas supply line 48 for supplying $N_2$ gas as an inert gas is connected to the gas supply line 45. A $N_2$ gas supply source 49 is connected to a base end side of the $N_2$ gas supply line 48. A flow rate controller 50 is installed in the $N_2$ gas supply line 48. By controlling the flow rate controllers 47 and 50, the coating compound gas and the $N_2$ gas are supplied at desired flow rates. Another inert gas such as Ar gas or the like may be used instead of $N_2$ gas.

A loading/unloading port 51 through which the wafer W is loaded into and unloaded from the vacuum transfer chamber 22 is installed at a sidewall of the processing chamber 41. The loading/unloading port 51 can be opened by a gate valve G. A gas exhaust line 52 is connected to a bottom wall of the processing chamber 41. A vacuum pump 53 is connected to the gas exhaust line 52. A pressure control valve 54 is installed in the gas exhaust line 52. A coating forming process is performed while setting a pressure in the processing chamber 41 to a predetermined level by controlling the pressure control valve 54.

In the coating forming apparatus 21c of the first example, the wafer W is transferred into the processing chamber 41 by opening the gate valve G between the vacuum transfer chamber 22 and the processing chamber 41 and then mounted on the mounting table 42 heated to 50° C. to 200° C., e.g., 150° C., by the heater 43. Then, the gate valve G is closed, and the processing chamber 43 is exhausted by the vacuum pump 53 so that a pressure in the processing chamber 43 can be controlled to a predetermined level of about 1 Pa to 133.3 Pa. Next, a coating compound gas and $N_2$ gas are introduced into the processing chamber 41. Accordingly, a coating is formed on the entire top surface of the interlayer insulation film containing Si on the surface of the wafer W.

Second Example

Figure 5:
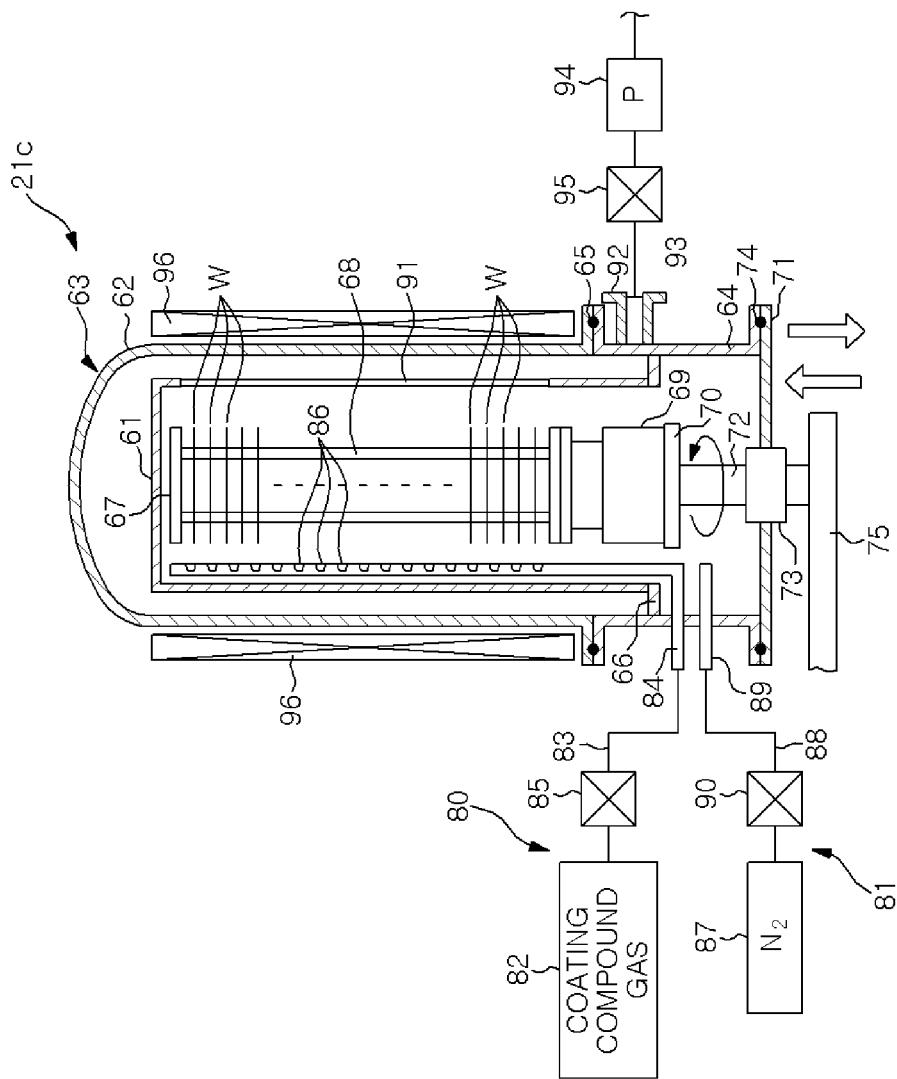
FIG. 5 is a cross sectional view showing a second example of the coating formation device that can be installed at the processing system shown in FIG. 3.

FIG. 5 is a cross sectional view showing a second example of the coating forming apparatus 21c. Here, a batch-type apparatus will be described as an example.

As shown in FIG. 5, the coating forming apparatus 21c of the present example includes a dual tubular processing chamber 63 having a cylindrical inner tube 61 having a ceiling and an open bottom and an outer tube 62 coaxially provided outside the inner tube 61. The inner tube 61 and the outer tube 62 are made of, e.g., quartz. A lower end of the outer tube 62 forming the processing chamber 63 is connected to a cylindrical manifold 64 made of, e.g., stainless steel, through a seal member 65 such as an O-ring or the like. In the same manner, the inner tube 61 forming the processing chamber 63 is supported on a supporting ring 66 attached to an inner wall of the manifold 64.

The manifold 64 has an opening at a lower end thereof. A vertical wafer boat 67 is inserted into the inner tube 61 through the opening formed at the lower end of the manifold 64. The vertical wafer boat 67 has a plurality of rods 68 provided with a plurality of supporting grooves (not shown). Peripheral portions of a plurality of, e.g., 50 to 100, wafers W as target objects are partially supported by the supporting grooves. Accordingly, the wafers W are stacked in the vertical wafer boat 67 at multiple levels in a height direction.

The vertical wafer boat 67 is mounted on a table 70 through a thermal insulation body 69 made of quartz. The table 70 is supported on a rotation shaft 72 penetrating through a lid 71 that blocks the opening formed at the lower end of the manifold 64, the lid 71 being made of, e.g., stainless steel. A magnetic fluid seal 73 is provided at a portion of the rotation shaft 72 penetrating through the lid and rotatably supports the rotation shaft 72 while airtightly sealing the rotation shaft 72. A seal member 74, e.g., an O-ring, is provided between a peripheral portion of the lid 71 and the lower end portion of the manifold 64. Accordingly, the processing chamber 63 is maintained in a sealed state. The rotation shaft 72 is attached to a leading end of an arm 75 supported by an elevation unit (not shown), e.g., a boat elevator or the like. As a consequence, the vertical wafer boat 67, the lid 71 and the like are vertically moved as one unit and inserted into and retracted from the inner tube 61 of the processing chamber 63.

The coating forming apparatus 21c includes a coating compound gas supply unit 80 for supplying a coating compound gas into the inner tube 61, and a $N_2$ gas supply unit 81 for supplying $N_2$ gas as an inert gas into the inner tube 61.

The coating compound gas supply unit 80 includes a coating compound gas supply source 82, a coating compound gas supply line 83 extending from the coating compound gas supply source 82, a distribution nozzle 84 connected to the coating compound gas supply line 83 and inserted into the manifold 64, and a flow rate controller 85 connected to the line 83. The distribution nozzle 84 that is, e.g., a quartz line, penetrates through the sidewall of the manifold 64 and extends in a vertical direction inside the manifold 64 while being bent in a height direction toward the inner line 61. A plurality of gas injection holes 86 spaced apart from each other at a predetermined interval is formed at a vertical portion of the distribution nozzle 84. Accordingly, the coating compound gas is substantially uniformly injected through the injection holes 86 in a horizontal direction.

The $N_2$ gas supply unit 81 includes a $N_2$ gas supply source 87, a $N_2$ gas supply line 88 extending from the $N_2$ gas supply source 87, a nozzle 89 connected to the $N_2$ gas supply line 88 and inserted into the manifold 64, and a flow rate controller 90 connected to the line 88. The nozzle 89 that is, e.g., a quartz line, penetrates through the sidewall of the manifold 64. The $N_2$ gas supplied from the nozzle 89 into the manifold 64 reaches the inside of the inner tube 61.

A gas exhaust port 91 for exhausting the inner tube 61 is provided at a sidewall portion of the inner tube 61 which is opposite to a sidewall portion where the distribution nozzle 84 is provided. The inner tube 61 communicates with an inside of the outer tube 62 through the gas exhaust port 91. The inside of the outer tube 62 communicates with a gas outlet 92 installed at the sidewall of the manifold 64. A gas exhaust line 93 is connected to the gas outlet 92. A vacuum pump 94 is connected to the gas exhaust line 93. A pressure control valve 95 is installed in the gas exhaust line 93. A coating forming process is performed while setting a pressure in the processing chamber 63 to a predetermined level by controlling the pressure control valve 95.

A cylindrical heating unit 96 is installed at an outer periphery of the outer tube 62. The heating unit 96 activates a gas supplied into the inner tube 61 and heats the wafers W accommodated in the inner tube 61.

In the coating forming apparatus 21c of the second example, first, in a transfer device (not shown) provided at a lower portion of the processing chamber 63, a plurality of, e.g., 50 to 1000 sheets of wafers W, is mounted on the wafer boat 67 at a room temperature, and the wafer boat 67 on which the wafers W are mounted is loaded while being raised from the lower side of the processing chamber 63 that has been controlled to a temperature of 50° C. to 200° C., e.g., 150° C., by the heating unit 96. The processing chamber 63 becomes a sealed space by blocking the opening formed at the lower end of the manifold 64 by the lid 71. A pressure in the processing chamber 63 is set to a predetermined level of 1 Pa to 133.3 Pa by evacuating the processing chamber 63. The process temperature is maintained by increasing the wafer temperature by controlling power supplied to the heating unit 96. The coating compound gas and $N_2$ gas are introduced into the processing chamber 63 while rotating the wafer boat 67. Accordingly, the coating is formed on the entire top surface of the interlayer insulation film containing Si on the surface of the wafer W.

(Test Result)

Hereinafter, a result of a test that has examined the effect of the present disclosure will be described.

Here, in order to simplify the phenomenon, the test was performed by using a sample in which a blanket low-k film is formed on Si. As for the low-k film, a SiOC-based film was used. The test was performed by scheme shown in FIG. 6.

First, a dielectric constant (k value) of a sample (sample A) that has been etched and ashed by performing plasma processing on the surface of the low-k film was measured immediately after the etching and the ashing. Another sample (sample B) that has been subjected to a coating forming process immediately after the etching and the ashing was left in the atmosphere for one week. Still another sample (sample C) was left in the atmosphere for one week without performing a coating forming process. A dielectric constant (k value) of the sample B was measured after removing the coating by wet cleaning. A dielectric constant (k value) of the sample C was measured after wet cleaning.

The etching and the ashing were performed under general conditions by a general plasma processing apparatus. The coating forming process was performed by the batch-type apparatus shown in FIG. 5 for about 10 minutes under conditions of 150° C. and 53.3 Pa by using N-phenyl-3-aminopropyltrimethoxysilane as a coating compound. The wet cleaning was performed by immersing the sample for one minute in DHF 1:1000 (dilute hydrofluoric acid diluted at 1000:1) as liquid chemical stored in a beaker.

The k value of the sample A was 3.40. The k value of the sample B was 3.39. This shows that the k value is hardly increased even after the exposure to an atmospheric atmosphere for one week due to the formation of the coating. The k value of the sample C was 3.57. This shows that when the coating is not formed, the k value is increased after the exposure to an atmospheric atmosphere for one week. From this, it is clear that the deterioration of the low-k film that is an interlayer insulation film can be controlled by forming the coating of the present invention.

The k value of the sample in which the wet cleaning was not performed after the coating forming process was 3.61. On the other hand, the k value of the sample in which the wet cleaning was not performed after heat treatment with the same thermal hysteresis as that of the coating forming process was performed instead of the coating forming process was 3.89. In other words, the increase in the k value was suppressed simply by performing the coating forming process. This is because damages of the low-k film are recovered and moisture absorption is controlled by the coating forming apparatus.

(Other Applications)

The present invention is not limited to the above embodiments and may be variously modified. For example, in the above embodiments, the coating was formed after the etching or the ashing, and then removed by the wet cleaning. However, the coating is not necessarily removed by the wet cleaning. In addition, although the Si-containing low-k film such as SiOC, SiOF or the like was described as an example of the interlayer insulation film, the interlayer insulation film may not contain Si as long as the coating can be formed by the coating compound gas.

In the above embodiments, the semiconductor wafer was used as the substrate to be processed. However, the substrate to be processed is not limited thereto and may be other substrates such as a substrate for FPD (flat panel display) and the like.

DESCRIPTION OF REFERENCE NUMERALS

1; processing system
2; processing unit
3; loader module
4; control unit

21a; etching apparatus
21b; ashing apparatus
21c; coating forming apparatus
22; vacuum transfer chamber
24; first transfer unit
102; interlayer insulation film
103; hard mask layer
104; trench
105; etching residue
106; coating
W; semiconductor wafer

What is claimed is:

1. A semiconductor device manufacturing method comprising:
    preparing a substrate to be processed having an interlayer insulation film;
    performing dry etching on the interlayer insulation film while using a mask layer to form recesses;
    forming a coating on an entire top surface of the substrate by a gas process using a gas of a coating compound with a molecular structure having at one end a first substitution group that reacts with and bonds to a surface of the interlayer insulation film and at the other end a second substitution group that is hydrophilic;
    removing the coating; and
    forming wiring in the recesses.

2. The semiconductor device manufacturing method of claim 1, wherein the interlayer insulation film contains Si, and the first substitution group of the coating compound bonds with Si of the interlayer insulation film.

3. The semiconductor device manufacturing method of claim 2, wherein the interlayer insulation film is a Si-containing low-k film.

4. The semiconductor device manufacturing method of claim 2, wherein the first substitution group of the coating compound is an alkoxysilyl group, and the alkoxysilyl group reacts with Si—OH of the interlayer insulation film to form siloxane bonds.

5. The semiconductor device manufacturing method of claim 4, wherein the second substitution group of the coating compound is an amino group.

6. The semiconductor device manufacturing method of claim 5, wherein the coating compound is selected among N-phenyl-3-aminopropyltrimethoxysilane, (N-(2-aminoethyl)-3-aminopropyltrimethoxysilane, 3-aminopropyltrimethoxysilane, and 3-aminopropyltriethoxysilane.

7. The semiconductor device manufacturing method of claim 1, wherein the dry etching is plasma etching.

8. The semiconductor device manufacturing method of claim 1, further comprising:
    performing dry ashing on the substrate that has been subjected to the dry etching,
    wherein the coating is formed after the dry ashing.

9. The semiconductor device manufacturing method of claim 8, wherein the dry ashing is plasma ashing.

10. The semiconductor device manufacturing method of claim 1, wherein the coating is removed by wet cleaning.

11. A coating formation method for forming a coating that protects an interlayer insulation film of a substrate to be processed, the coating being removable in a subsequent process, after dry etching is performed to form recesses for wiring formation on the interlayer insulation film or after dry ashing is performed after the dry etching, wherein:
    the coating is formed on the interlayer insulation film by a gas process using a gas of a coating compound with a molecular structure having at one end a first substitution group that reacts with and bonds to a surface of the interlayer insulation film and at the other end a second substitution group that is hydrophilic.

12. The coating formation method of claim 11, wherein the interlayer insulation film contains Si, and the first substitution group of the coating compound bonds with Si of the interlayer insulation film.

13. The coating formation method of claim 12, wherein the interlayer insulation film is a Si-containing low-k film.

14. The coating formation method of claim 12, wherein the first substitution group of the coating compound is an alkoxysilyl group, and the alkoxysilyl group reacts with Si—OH of the interlayer insulation film to form siloxane bonds.

15. The coating formation method of claim 14, wherein the second substitution group of the coating compound is an amino group.

16. The coating formation method of claim 15, wherein the coating compound is selected among N-phenyl-3-aminopropyltrimethoxysilane, (N-(2-aminoethyl)-3-aminopropyltrimethoxysilane, 3-aminopropyltrimethoxysilane, and 3-aminopropyltriethoxysilane.

* * * * *